United States Patent
Milic-Strkalj

(10) Patent No.: US 10,438,979 B2
(45) Date of Patent: Oct. 8, 2019

(54) METHOD OF FABRICATING FILL FACTOR ENHANCEMENT FOR IMAGE SENSOR

(71) Applicant: OmniVision Technologies, Inc., Santa Clara, CA (US)

(72) Inventor: Ognjen Milic-Strkalj, San Jose, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 0 days.

(21) Appl. No.: 16/150,876

(22) Filed: Oct. 3, 2018

(65) Prior Publication Data

US 2019/0035833 A1 Jan. 31, 2019

Related U.S. Application Data

(62) Division of application No. 15/257,548, filed on Sep. 6, 2016, now Pat. No. 10,121,806.

(51) Int. Cl.
*H01L 31/062* (2012.01)
*H01L 27/146* (2006.01)

(52) U.S. Cl.
CPC .... *H01L 27/14605* (2013.01); *H01L 27/1463* (2013.01); *H01L 27/14612* (2013.01); *H01L 27/14643* (2013.01); *H01L 27/14689* (2013.01); *H01L 27/14641* (2013.01)

(58) Field of Classification Search
CPC .......... H01L 27/14605; H01L 27/1463; H01L 27/14643
See application file for complete search history.

(56) References Cited

U.S. PATENT DOCUMENTS 9,356,163 B1 * 5/2016 Liu .................. H01L 31/02327
2017/0141145 A1 * 5/2017 Yamashita .......... H01L 27/1464

* cited by examiner

*Primary Examiner* — Matthew E. Gordon
(74) *Attorney, Agent, or Firm* — Christensen O'Connor; Johnson Kindness PLLC

(57) ABSTRACT

An image sensor includes a plurality of photodiodes disposed in a semiconductor material and a plurality of isolation structures disposed between individual photodiodes in the plurality of photodiodes. The plurality of isolation structures electrically isolate individual photodiodes in the plurality of photodiodes. A plurality of transistors are disposed proximate to the plurality of photodiodes and include a reset transistor, an amplifier transistor, and a row select transistor. An active region and a gate electrode of at least one transistor in the plurality of transistors are vertically aligned with an isolation structure in the plurality of isolation structures.

8 Claims, 5 Drawing Sheets

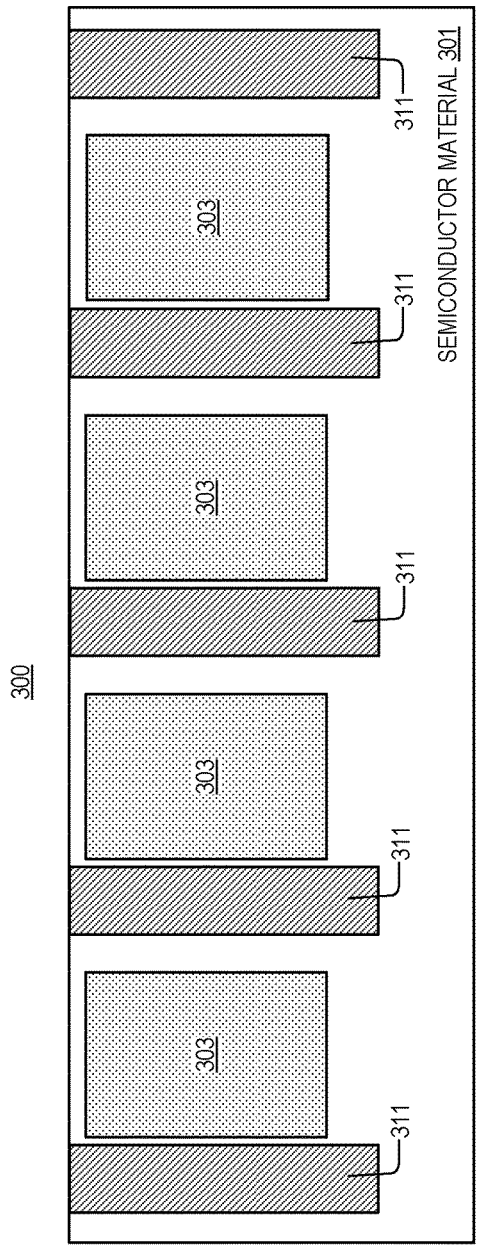
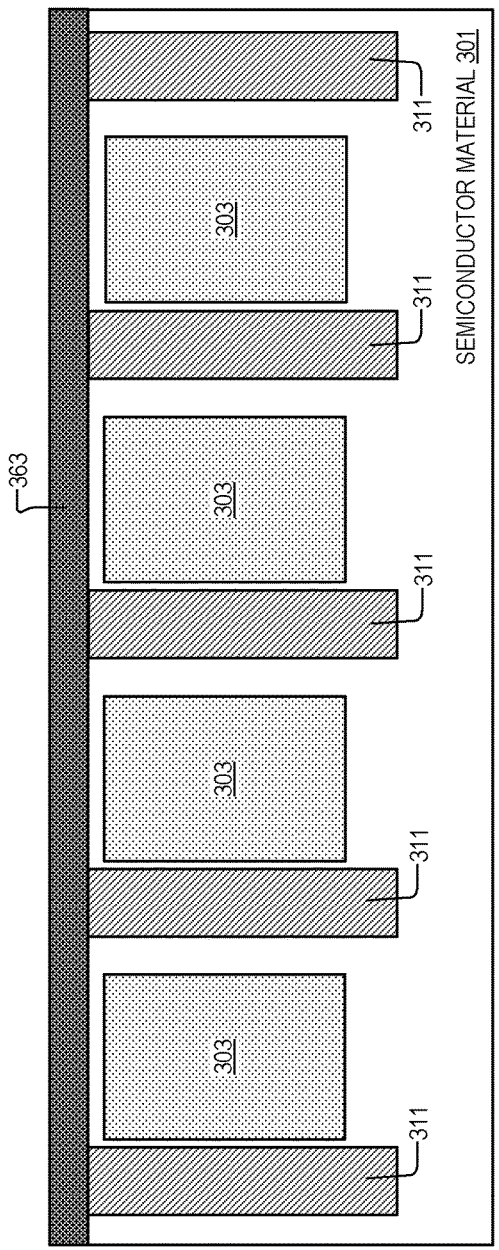
FIG. 3A
FIG. 3B

METHOD OF FABRICATING FILL FACTOR ENHANCEMENT FOR IMAGE SENSOR

CROSS-REFERENCE TO RELATED APPLICATIONS

This application is a divisional of U.S. patent application Ser. No. 15/257,548, filed on Sep. 6, 2016, which is hereby incorporated by reference.

TECHNICAL FIELD

This disclosure relates generally to semiconductor fabrication and more specifically to the position of circuitry in an image sensor.

BACKGROUND INFORMATION

Image sensors have become ubiquitous. They are widely used in digital still cameras, cellular phones, security cameras, as well as, medical, automobile, and other applications. The technology used to manufacture image sensors has continued to advance at a great pace. For example, the demands of higher resolution and lower power consumption have encouraged the further miniaturization and integration of these devices.

The trend in pixel development toward smaller photodiodes and detection of longer absorbed wavelengths necessitates enhanced optical and electrical isolation between individual photodiodes. To improve isolation many approaches have been suggested; all of these approaches consume valuable real estate on the image sensor wafer. The area of each pixel generally consists of isolation structures, photodiodes—which, preferably, are made as large as possible—and accompanying in-pixel transistors necessary for imager operation. Area consumed by isolation and in-pixel transistors is likely not available for photodiodes. Thus, minimizing isolation and transistor regions is desirable to maximize photodiode area.

BRIEF DESCRIPTION OF THE DRAWINGS

Non-limiting and non-exhaustive examples of the invention are described with reference to the following figures, wherein like reference numerals refer to like parts throughout the various views unless otherwise specified.

FIGS. 3A-3D illustrate an example method for forming the image sensor of FIG. 1A, in accordance with the teachings of the present invention.

Figure 1A:
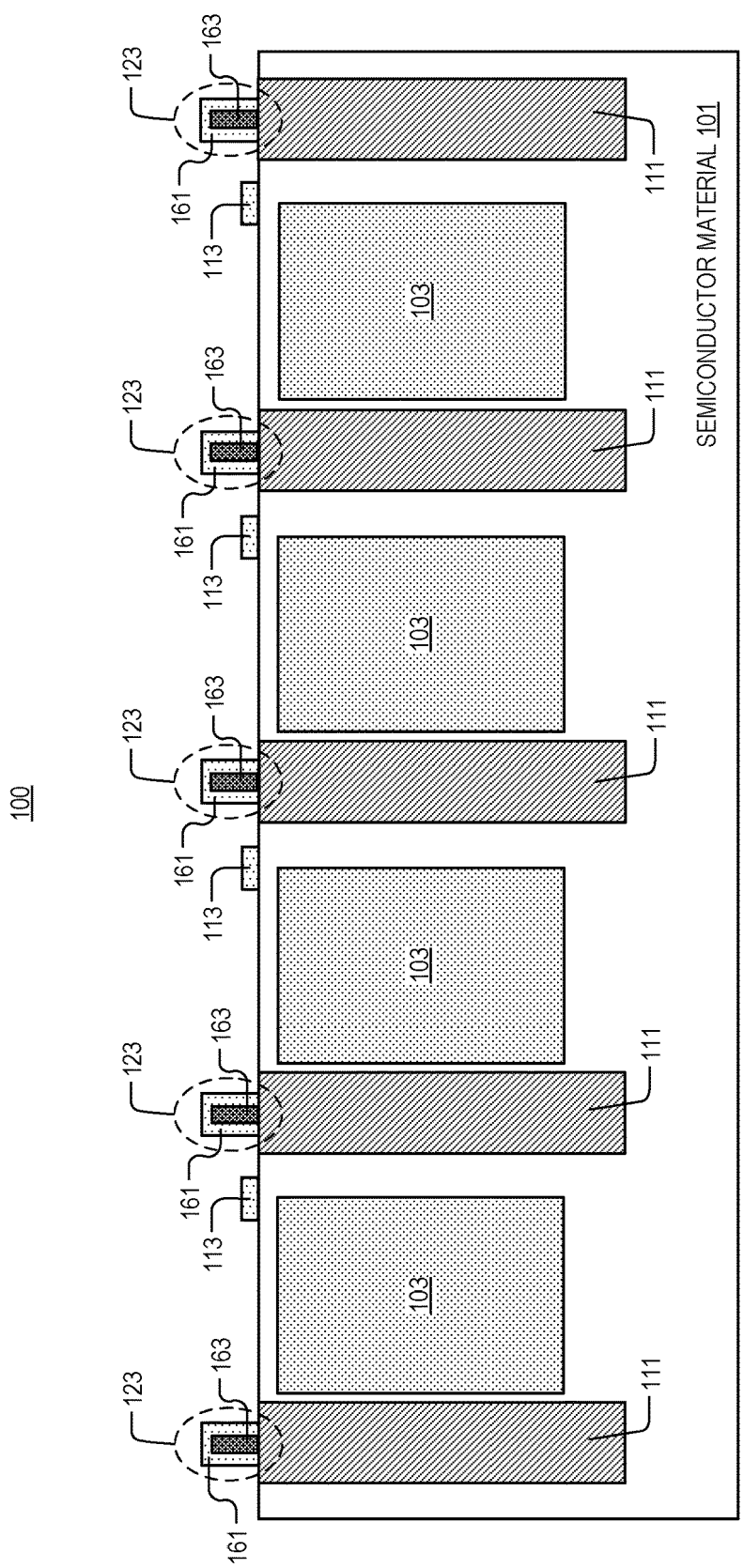
FIG. 1A is a cross sectional illustration of an example image sensor, in accordance with the teachings of the present invention.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention.

DETAILED DESCRIPTION

Examples of an apparatus and method for fill factor enhancement are described herein. In the following description, numerous specific details are set forth to provide a thorough understanding of the examples. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one example" or "one embodiment" means that a particular feature, structure, or characteristic described in connection with the example is included in at least one example of the present invention. Thus, the appearances of the phrases "in one example" or "in one embodiment" in various places throughout this specification are not necessarily all referring to the same example. Furthermore, the particular features, structures, or characteristics may be combined in any suitable manner in one or more examples.

Throughout this specification, several terms of art are used. These terms are to take on their ordinary meaning in the art from which they come, unless specifically defined herein or the context of their use would clearly suggest otherwise. It should be noted that element names and symbols may be used interchangeably through this document (e.g., Si vs. silicon); however, both have identical meaning.

The systems and methods depicted here may be used to increase fill factor by reducing the amount of semiconductor material consumed by the circuitry needed to operate photodiodes in an image sensor. By moving some of this circuitry out of the semiconductor material and on top of an isolation structures, more or larger photodiodes may be formed in the semiconductor material. This results in greater fill factor and higher sensitivity of the pixel.

FIG. 1A is a cross sectional illustration of an example image sensor 100. Image sensor 100 includes semiconductor material 101, plurality of photodiodes 103, plurality of isolation structures 111, fin-field effect transistor 123 (including active region 163, and gate electrode 161), and transfer gate 113.

In the illustrated example, plurality of photodiodes 103 is disposed in semiconductor material 101, and plurality of isolation structures 111 is disposed between individual photodiodes 103 in plurality of photodiodes 103. The plurality of isolation structures 111 electrically isolate individual photodiodes 103 from one another as well as other circuitry disposed in image sensor 100. A plurality of transistors is disposed proximate to plurality of photodiodes 103 including a reset transistor (see infra FIG. 1B), an amplifier transistor (see infra FIG. 1B), and a row select transistor (see infra FIG. 1B). The active region 163 and gate electrode 161 of at least one transistor 123 in the plurality of transistors are vertically aligned with an isolation structure 111 in the plurality of isolation structures 111. Active region 163 and gate electrode 161 of at least one transistor 123 are also optically aligned with isolation structure 111 to maximize light absorption by plurality of photodiodes 103 (i.e., active region 163 and gate electrode 161 do not block light entering photodiodes 103). As shown, the at least one transistor 123 is a fin-field effect transistor ("Fin-FET"), and the lateral bounds of active region 163 and gate electrode 161 of the at least one transistor 123 are smaller than lateral bounds of the isolation structure 111. As will be discussed in greater detail later, plurality of isolation structures 111 may be etched into the semiconductor material 101, and backfilled with at least one of a metal, a semiconductor, or an oxide material. Plurality of isolation structures 111 may also include doped semiconductor material 101 or any other suitable isolation material.

In one example, the Fin-FET 123 has a non-planar active region 163 and a single wrap-around gate electrode 161. In other examples, the Fin-FET may have multiple gate electrodes. In many examples, the thickness of the fin (measured from source to drain) determines the channel length of the device. The wrap-around gate structure provides for better electrical control over the channel. Moreover, this gate structure helps overcome short-channel effects and reduces leakage current.

Image sensor 100 also includes transfer gate 113 laterally disposed between two isolation structures 111, and laterally coextensive with at least part of an individual photodiode 103 in the plurality of photodiodes 103. In one example, gate electrode 161 and transfer gate 113 include polysilicon, and active region 163 includes single crystal silicon. However, as will be shown in FIGS. 3A-3D, any suitable conductive material may be used for gate electrode 161 and transfer gate 113, and any semiconducting material with a sufficiently large charge-carrier mobility may be used for active region 163. Image sensor 100 may be a front side illuminated or backside illuminated image sensor where, as one skilled in the art will appreciate, the "frontside" is the side of semiconductor material 101 with pixel circuitry.

Figure 1B:
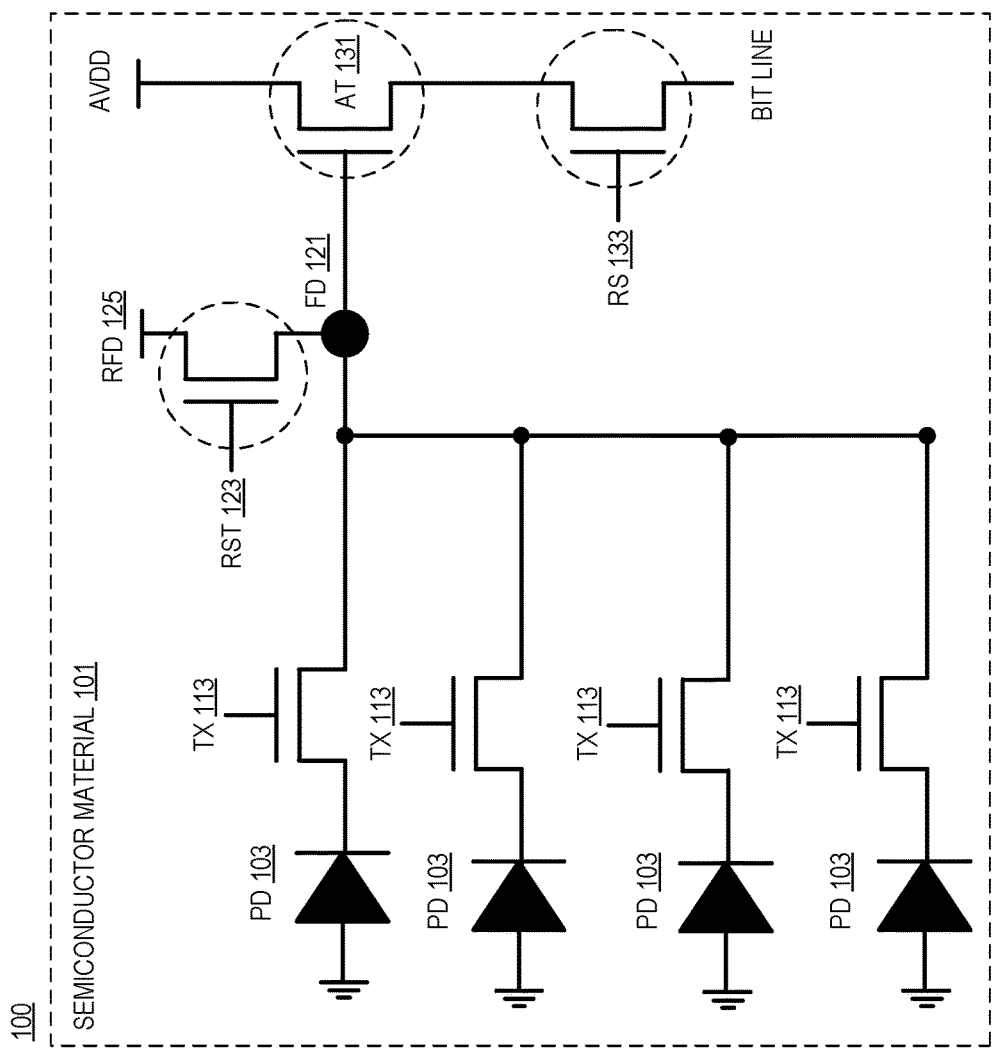
FIG. 1B illustrates a circuit diagram of the image sensor in FIG. 1A, in accordance with the teachings of the present invention.

FIG. 1B is a circuit diagram of image sensor 100 in FIG. 1A. In the depicted example, image sensor 100 includes semiconductor material 101, plurality of photodiodes 103, plurality of transfer gates 113, floating diffusion 121, reset transistor 123, amplifier transistor 131, and row select transistor 133. Plurality of photodiodes 103 is disposed in semiconductor material 101 to accumulate image charge in response to incident light directed into plurality of photodiodes 103. In one example, semiconductor material 101 may include silicon, but may include other suitable semiconductor materials and dopant atoms. Plurality of transfer gates 113 is also disposed in semiconductor material 101 and individual transfer gates 113 in plurality of transfer gates 113 are coupled to individual photodiodes 103 in plurality of photodiodes 103 to transfer charge out of photodiodes 103. Floating diffusion 121 is disposed in semiconductor material 101, and floating diffusion 121 is coupled to the plurality of transfer gates 113 to receive image charge from plurality of photodiodes 103 in response to a transfer signal sequentially applied to a control terminal of each individual transfer gate 113. In other words, in the depicted example, a transfer signal is applied to the control terminal of the top transfer gate 113, then a transfer signal is applied to the control terminal of the second-from-the-top transfer gate 113, etc. Reset transistor 123 is coupled to floating diffusion 121 to extract the image charge from floating diffusion 121. Further, the gate electrode of amplifier transistor 131 is coupled to floating diffusion 121, and row select transistor 133 is coupled between an output of amplifier transistor 131 and a bit line output. In one example, amplifier transistor 131 includes a source follower coupled transistor.

As illustrated by the dashed lines encircling reset transistor 123, amplifier transistor 131, and row select transistor 133, the at least one transistor (e.g., Fin-FET transistor 123 of FIG. 1A, which is vertically aligned with isolation structure 111) may be one of reset transistor 123, amplifier transistor 131, or row select transistor 133. In other examples, the Fin-FET transistor may be the transfer gate 113. Moreover, more than one transistor depicted in FIG. 1B may be constructed as Fin-FET over an isolation structures 111, thus further reducing the amount of area in semiconductor material 101 that is filled by pieces of device architecture other than photodiodes 103. Fin-FETs may further be placed over other pieces of device architecture that do not interfere with image acquisition. For instance, in some image sensors, black pixels are used to measure a baseline potential of the photodiodes. Because, by definition, light is prevented from reaching black pixels, support circuitry may be formed over black pixels to create room for additional image light receiving photodiodes. This same logic may be applied to other non-light receiving pieces of device architecture.

In the depicted example, plurality of photodiodes 103 includes four photodiodes 103 coupled to floating diffusion 121 through transfer gates 113. However, in a different example, any number of photodiodes 103 may be coupled to floating diffusion 121 including two, six, and eight photodiodes 103. In the depicted example, the four photodiodes 103 include two photodiodes 103 disposed to absorb green light, one photodiode 103 disposed to absorb blue light, and one photodiode 103 disposed to absorb red light. Although not depicted in FIG. 1B, color selection may be accomplished by placing a color filter layer proximate to semiconductor material 101. In one example, the color filter layer includes red, green, and blue color filters which may be arranged into a Bayer pattern, EXR pattern, X-trans pattern, or the like. However, in a different or the same example, the color filter layer may include infrared filters, ultraviolet filters, or other light filters that isolate invisible portions of the EM spectrum. In the same or a different example, a microlens layer is formed on the color filter layer. The microlens layer may be fabricated from a photo-active polymer that is patterned on the surface of the color filter layer. Once rectangular blocks of polymer are patterned on the surface of the color filter layer, the blocks may be melted (or reflowed) to form the dome-like structure characteristic of microlenses.

Figure 2:
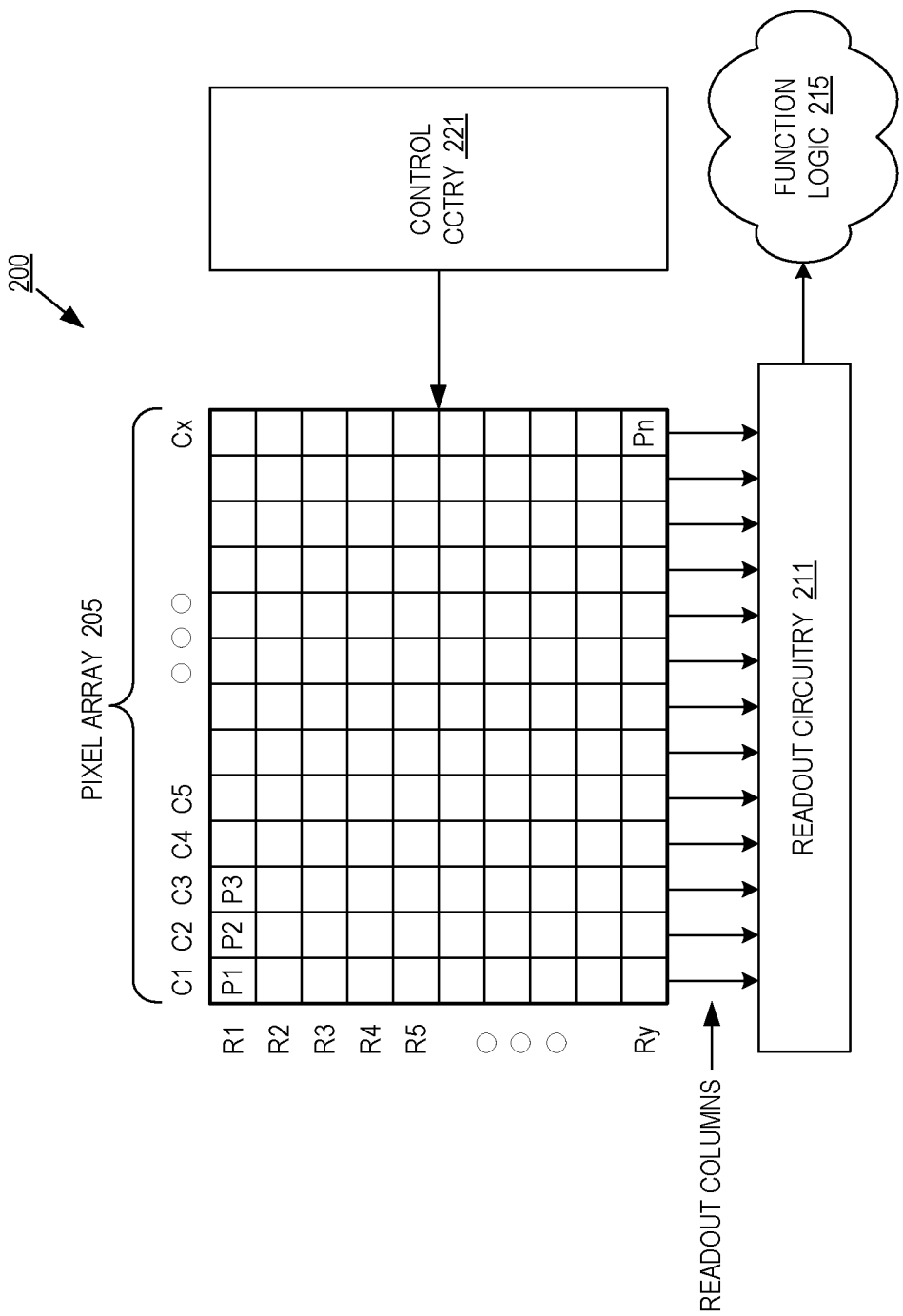
FIG. 2 illustrates a block diagram of an imaging system including the image sensor of FIG. 1A, in accordance with the teachings of the present invention.

FIG. 2 is a block diagram illustrating one example of imaging system 200 (including image sensor 100 of FIG. 1A). Imaging system 200 includes pixel array 205, control circuitry 221, readout circuitry 211, and function logic 215. In one example, pixel array 205 is a two-dimensional (2D) array of photodiodes, or image sensor pixels (e.g., pixels P1, P2 . . . , Pn). As illustrated, photodiodes are arranged into rows (e.g., rows R1 to Ry) and columns (e.g., column C1 to Cx) to acquire image data of a person, place, object, etc., which can then be used to render a 2D image of the person, place, object, etc. However, photodiodes do not have to be arranged into rows and columns and may take other configurations.

In one example, after each image sensor photodiode/pixel in pixel array 205 has acquired its image data or image charge, the image data is readout by readout circuitry 211 and then transferred to function logic 215. In various examples, readout circuitry 211 may include amplification circuitry, analog-to-digital (ADC) conversion circuitry, or otherwise. Function logic 215 may simply store the image data or even manipulate the image data by applying post image effects (e.g., crop, rotate, remove red eye, adjust brightness, adjust contrast, or otherwise). In one example, readout circuitry 211 may readout a row of image data at a time along readout column lines (illustrated) or may readout the image data using a variety of other techniques (not illustrated), such as a serial readout or a full parallel readout of all pixels simultaneously.

In one example, control circuitry 221 is coupled to pixel array 205 to control operation of the plurality of photodiodes in pixel array 205. For example, control circuitry 221 may generate a shutter signal for controlling image acquisition. In one example, the shutter signal is a global shutter signal for simultaneously enabling all pixels within pixel array 205 to simultaneously capture their respective image data during a single acquisition window. In another example, the shutter signal is a rolling shutter signal such that each row, column, or group of pixels is sequentially enabled during consecutive acquisition windows. In another example, image acquisition is synchronized with lighting effects such as a flash.

In one example, imaging system 200 may be included in a digital camera, cell phone, laptop computer, automobile or the like. Additionally, imaging system 200 may be coupled to other pieces of hardware such as a processor (general purpose or otherwise), memory elements, output (USB port, wireless transmitter, HDMI port, etc.), lighting/flash, electrical input (keyboard, touch display, track pad, mouse, microphone, etc.), and/or display. Other pieces of hardware may deliver instructions to imaging system 200, extract image data from imaging system 200, or manipulate image data supplied by imaging system 200.

FIGS. 3A-3D illustrate an example method 300 for forming the image sensor of FIG. 1A, in accordance with the teachings of the present invention. The order in which some or all of the processes depicted should not be deemed limiting. Rather, one of ordinary skill in the art having the benefit of the present disclosure will understand that some of method 300 may be executed in a variety of orders not illustrated, or even in parallel. Furthermore, method 300 may omit certain processes in order to avoid obscuring certain aspects. Alternatively, method 300 may include additional processes that may not be necessary in some embodiments/examples of the disclosure.

FIG. 3A illustrates forming plurality of photodiodes 303 in first semiconductor material 301. Plurality of photodiodes 303 may be formed by ion implantation or other semiconductor processing technique. Individual photodiodes 303 in plurality of photodiodes 303 are separated from each other by individual isolation structures 111 in plurality of isolation structures 111.

In one example, the plurality of isolation structures 311 are formed by etching trenches—both wet or dry etchant may be suitable—between the individual photodiodes 303, and the trenches are backfilled with at least one of a metal, an oxide, or a semiconductor material. High-k dielectrics may be used to pin charge and prevent electrons from drifting between plurality of photodiodes 303. In some embodiments, a metal may be deposited onto walls of the trenches and then an oxide material may back fill the trenches. Isolation structures 311 may include a number of semiconductor elements and dopants. In some examples, isolation structures 311 may also include oxides/nitrides such as silicon oxide ($SiO_2$), hafnium oxide ($HfO_2$), silicon nitride ($Si_3N_4$), silicon oxynitirde ($SiO_xN_y$), tantalum oxide ($Ta_2O_5$), titanium oxide ($TiO_2$), zirconium oxide ($ZrO_2$), aluminum oxide ($Al_2O_3$), lanthanum oxide ($La_2O_3$), praseodymium oxide ($Pr_2O_3$), cerium oxide ($CeO_2$), neodymium oxide ($Nd_2O_3$), promethium oxide ($Pm_2O_3$), samarium oxide ($Sm_2O_3$), europium oxide ($Eu_2O_3$), gadolinium oxide ($Gd_2O_3$), terbium oxide ($Tb_2O_3$), dysprosium oxide ($Dy_2O_3$), holmium oxide ($Ho_2O_3$), erbium oxide ($Er_2O_3$), thulium oxide ($Tm_2O_3$), ytterbium oxide ($Yb_2O_3$), lutetium oxide ($Lu_2O_3$), yttrium oxide ($Y_2O_3$), or the like. Additionally, one skilled in the relevant art, will recognize that any stoichiometric combination of the above metals/semiconductors and their oxides/nitrides/oxynitrides may be used, in accordance with the teachings of the present invention.

In one or more examples, isolation structures 311 may act as light guides. Light entering the plurality of photodiodes 303 may be totally internally reflected by the plurality of isolation structures 311. The dielectric constant of isolation structures 311 may be tuned to promote total internal reflection. Moreover, reflecting structures may be placed on the non-illumined side of the image sensor to reflect light back into plurality of photodiodes 303. Fabrication of both or one of these type of structures may help increase the number of photons absorbed by photodiodes 303.

FIG. 3B shows depositing second semiconductor material 363 proximate to first semiconductor material 301. In the depicted example, first semiconductor material 301 is single crystalline (e.g., a single crystal Si wafer) is used as a seed crystal to form the second semiconductor material 363 (which may also be single crystalline). In some examples, second semiconductor material 363 may be grown by at least one of epitaxial lateral overgrowth or by solid-phase epitaxial regrowth depending on the type of materials used for first semiconductor material 301 and second semiconductor material 363. As second semiconductor material 363 is grown on first semiconductor material 301, it may eventually grow over the isolation regions, thus supplying the semiconductor material used to form the active region of Fin-FET 323.

In some examples silicon may be the choice semiconductor for both first semiconductor material 301 and second semiconductor material 363; however, in other examples other semiconductor materials may be used including any group 3 elements (B, Al, Ga, In, Tl), group 4 elements (C, Si, Ge, Sn, Pb), group 5 elements (N, P, As, Sb, Bi), or their various compounds.

Figure 3C:
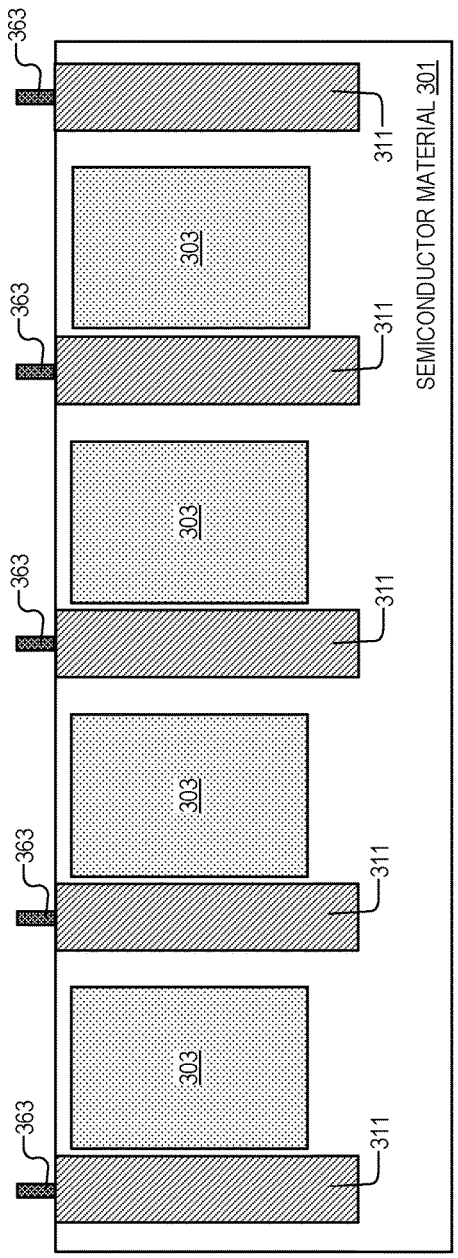

FIG. 3C illustrates removing a first portion of second semiconductor material 363, such that a second portion of the second semiconductor material 363 remains disposed between lateral bounds of an individual isolation structure 311. The width of the remaining portion of second semiconductor material 363 may be a small fraction of the width of individual isolation structure 311. For example the lateral bounds of the remaining second semiconductor material 363 may be anywhere from 50%-1% of the lateral bounds of the individual isolation structure 311. Additionally, remaining second semiconductor material 363 may be located anywhere in the bounds of the isolation structure 311 and not just in the center (as depicted).

Figure 3D:
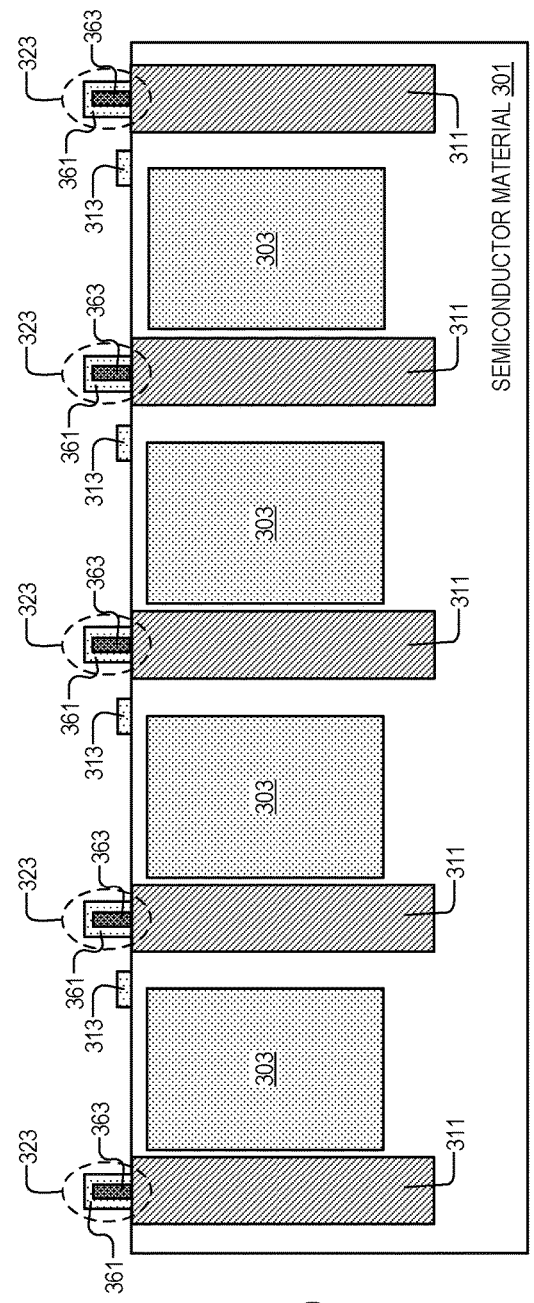

FIG. 3D shows depositing conductive material 361 on a surface of the second portion of the second semiconductor material 363. Although not shown in FIG. 3D, conductive material 361 may be deposited across the whole surface of the device so that it is conformal with the top surface of semiconductor material 301 and the remaining portion of second semiconductor material 363. In one example, the conductive material 361 is deposited to cover at least some of the plurality of photodiodes 303 and the second portion of second semiconductor material 363. Then, a portion of conductive material 361 is removed to form the gate electrode of the Fin-FET 323 and a transfer gate 313 of a transfer transistor. Transfer gate 313 of a transfer transistor may be partially laterally coextensive with an individual photodiode 103. In other words, part of transfer gate 313 may be disposed over an edge of photodiode 303. In one example, conductive material 361 includes polycrystalline semiconductor, and the first semiconductor material 301 and the second semiconductor material 363 include single crystalline semiconductor (see supra discussion of possible semiconductor materials above).

The above description of illustrated examples of the invention, including what is described in the Abstract, is not intended to be exhaustive or to limit the invention to the precise forms disclosed. While specific examples of the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific examples disclosed in the specification. Rather, the scope of the invention is to be determined entirely by the following claims, which are to be construed in accordance with established doctrines of claim interpretation.

What is claimed is:

1. A method of image sensor fabrication, comprising:
    forming a plurality of photodiodes in a first semiconductor material, wherein individual photodiodes in the plurality of photodiodes are separated from each other by individual isolation structures in a plurality of isolation structures;
    depositing a second semiconductor material proximate to the first semiconductor material;
    removing a first portion of the second semiconductor material, wherein a second portion of the second semiconductor material remains disposed between lateral bounds of an individual isolation structure; and
    depositing a conductive material on a surface of the second portion of the second semiconductor material, wherein the conductive material on the surface of the second portion of the second semiconductor material and the second semiconductor material form a gate electrode and an active region, respectively, of a fin-field effect transistor ("Fin-FET"), and wherein there is only one Fin-FET disposed between the lateral bounds of each of the individual isolation structures.

2. The method of claim 1, wherein depositing the conductive material includes depositing the conductive material to cover at least some of the plurality of photodiodes and the second portion of the second semiconductor material, and wherein a portion of the conductive material is removed to form the gate electrode of the Fin-FET and a transfer gate of a transfer transistor.

3. The method of claim 2, wherein the conductive material includes polycrystalline semiconductor, and the first semiconductor material and the second semiconductor material include single crystalline semiconductor.

4. The method of claim 2, wherein the transfer gate of a transfer transistor is partially laterally coextensive with an individual photodiode.

5. The method of claim 3, wherein the first semiconductor material is used as a seed crystal to form the second semiconductor material, and wherein the second semiconductor material is grown by at least one of epitaxial lateral overgrowth or by solid-phase epitaxial regrowth.

6. The method of claim 1, wherein the plurality of isolation structures are formed by etching trenches between the individual photodiodes in the plurality of photodiodes, and wherein the trenches are backfilled with at least one of a metal, an oxide, or a semiconductor material.

7. The method of claim 1, wherein the Fin-FET is one of a reset transistor, an amplifier transistor, or a row select transistor.

8. The method of claim 1, wherein the plurality of photodiodes are formed by ion implantation.

* * * * *